INVENTORS
KAMIL Y. JABBAR
OLE K. NILSSEN
BY Mueller, Aichele & Rauner
ATTYS.

INVENTORS
KAMIL Y. JABBAR
OLE K. NILSSEN
BY Mueller, Aichele & Rauner
ATTYS.

United States Patent Office 3,521,204
Patented July 21, 1970

3,521,204

ELECTRONICALLY TUNED PUSHBUTTON RADIO HAVING STATION SELECTING COMPARISON MEANS

Ole K. Nilssen, Bensenville, and Kamil Y. Jabbar, River Grove, Ill., assignors to Motorola, Inc., Franklin Park, Ill., a corporation of Illinois Filed Jan. 3, 1969, Ser. No. 788,767
Int. Cl. H03j 5/04, 5/32
U.S. Cl. 334—7 10 Claims

ABSTRACT OF THE DISCLOSURE

An electronic pushbutton tuning system is utilized to provide for tuning of a radio by varying the bias on voltage variable capacitors in the antenna, RF and local oscillator stages of the radio. A manual tuning control and a plurality of pushbutton circuits each include a potentiometer for selecting the desired voltage to be used in tuning the voltage variable capacitors, and a switching circuit is employed to select the particular one of the tuning circuits which is used to control the bias voltage on the voltage variable capacitors. Whenever a desired station is selected by the manual tuning control, subsequent selection of a pushbutton tuning control circuit causes the output of the selected pushbutton protentiometer to be compared with the output of the manual tuning potentiometer in a comparator circuit; and the pushbutton potentiometer then may be adjusted until the comparator circuit indicates that the settings of the two potentiometers are the same. When this indication is reached, the pushbutton potentiometer is set to the same station previously selected by manual tuning; so that subsequent selection of this same pushbutton will provide for selection of that station.

BACKGROUND OF THE INVENTION

It has been proposed to electronically tune a radio receiver by using a potentiometer to vary a direct current bias on voltage variable capacitors in the tuned circuit stages of the receiver. Electronic tuning is especially desirable to provide tuning of an automobile radio from more than one location by positioning remote tuning stations in locations such as the arm rests on the doors in the front and back seats. In order to make the operation of such a system most convenient, it is desirable to provide a means for individually setting pushbuttons to desired station locations by the user of the radio. This can be accomplished by providing individual tuning potentiometers for each of the pushbuttons.

One disadvantage to the use of individual potentiometers associated with each of the pushbuttons in such a radio is the possibility of losing the desired station before the user of the radio can locate it while varying the pushbutton potentiometer. This can occur when the station changes its programming or ceases broadcasting at the particular time that the pushbutton potentiometer is being adjusted to its correct position. Thus, when a desirable station is found by the user of the radio through manual tuning, it is desirable to provide some means for providing an indication that adjustment of a pushbutton to correspond to the station located by manual tuning has been effected, even though the station changes its programming content or creases broadcasting.

SUMMARY OF THE INVENTION

It is an object of this invention to provide an improved pushbutton operation for an electronically tuned wave signal receiver.

Another object of this invention is to provide a system for indicating when a station being selected by a pushbutton corresponds to a station previously selected by means of manual tuning.

It is an additional object of this invention to indicate when the setting of a potentiometer in the pushbutton circuit of an electronically tuned radio receiver corresponds to a setting of a different potentiometer previously set by manual tuning means.

In a preferred embodiment of this invention, voltage variable capacitors are positioned in the tuned circuit stages of a radio receiver. An electronic pushbutton tuner, including a manual control unit and a plurality of pushbutton controlled circuits is provided, with the manual control unit and the pushbutton circuits operable to apply a variable DC potential to the voltage variable capacitors through a potentiometer associated, respectively, with the manual tuning unit and each of the pushbutton circuits, thereby electronically tuning the tuned circuits of the radio receiver to a desired frequency. In order to assist in setting the potentiometer of a pushbutton to a desired station location corresponding to one already tuned by the manual tuning unit, a comparison means is provided, with inputs obtained from the potentiometers of the manual tuning unit and the selected pushbutton circuit. The settings of the potentiometers are compared to provide an output indicative of a correlation of the settings of the manual tuning potentiometer and the selected pushbutton potentiometer.

DETAILED DESCRIPTION

Figure 1:
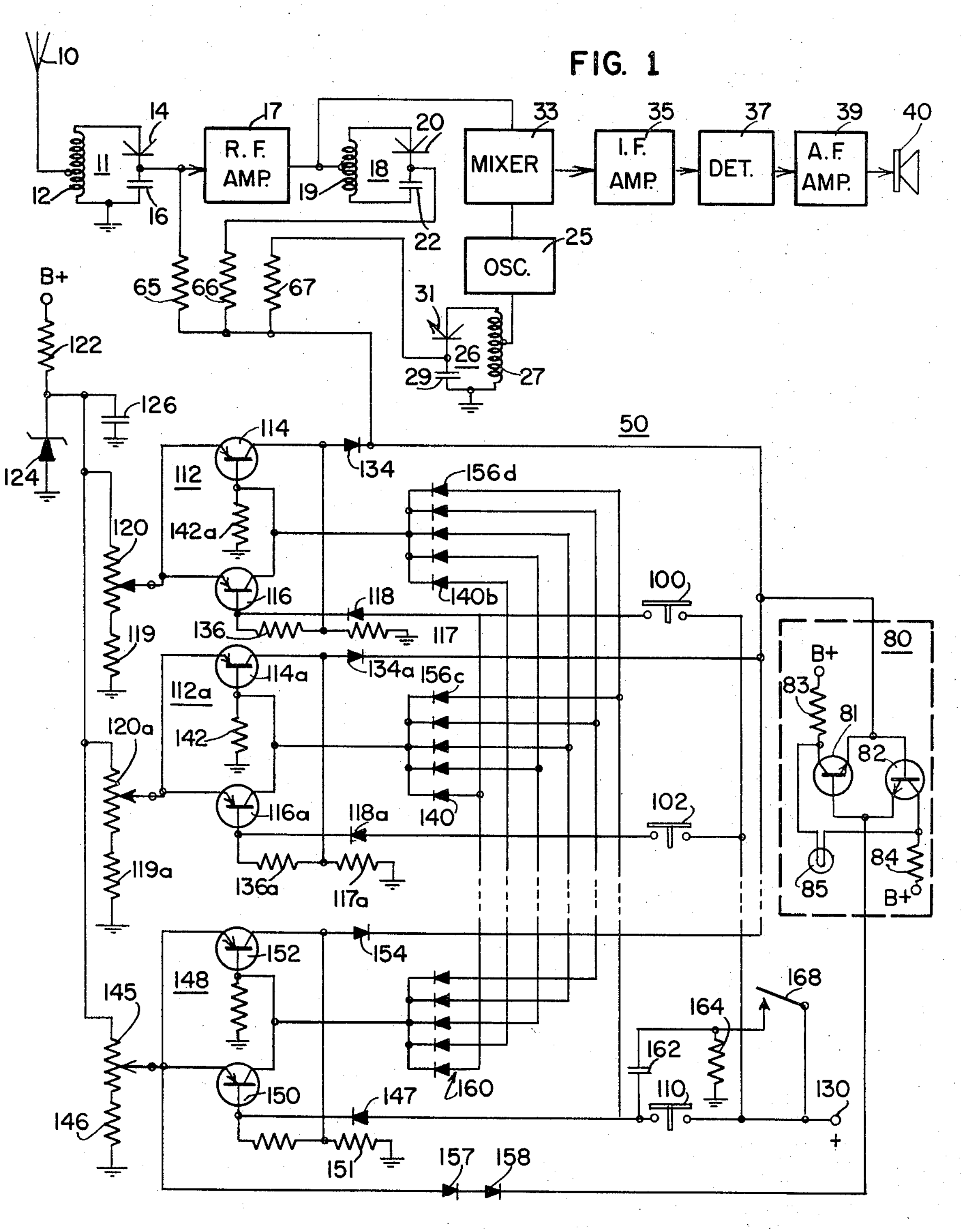
FIG. 1 is a wiring diagram partially in block form illustrating an electronically tuned radio in accordance with a preferred embodiment of this invention.

Referring to FIG. 1 of the drawing, there is shown a wave signal receiver having an antenna 10 which supplies input signals to an impedance matching point on the primary winding 12 of an antenna tuned circuit 11, which includes a blocking capacitor 16 and a voltage variable capacitor or reactance device 14. The voltage variable capacitor 14 is a two-terminal PN junction semiconductor device of the type which exhibits a change in capacitance proportional to a change in the direct current bias applied across the device. By varying the direct current bias on the voltage variable capacitor 14, the antenna 10 can be tuned through a predetermined radio frequency range.

The received signal is coupled from the tuned circuit 11 to an RF amplifier 17 where it is amplified and connected to an impedance matching point on the primary winding 19 of an RF tuned circuit 18, also including a voltage variable capacitor 20 and a blocking capacitor 22. The capacitor 20 is of a similar type to the capacitor 14 which is used in the tuned circuit 11. In order to heterodyne the radio frequency signals, a local oscillator 25 is provided and includes a tuned circuit 26 having a primary winding 27 and a blocking capacitor 29 and voltage variable capacitor 31. The voltage variable capacitor 31 also is similar to the capacitor 14 used in the antenna tuned circuit 11. Signals from the oscillator 25 then are combined with the RF signals obtained from the RF amplifier 17 in a mixer 33, resulting in an intermediate frequency signal which is amplified in an IF amplifier 35. The output signals from the IF amplifier 35 then are supplied to a detector 37 and coupled to an audio amplifier 39 which drives a speaker 40.

In order to tune the radio receiver just described, varying direct current biasing potentials must be supplied to the voltage variable capacitors 14, 20 and 31; and this is accomplished by obtaining an output from a pushbutton tuner 50 which supplies varying DC potentials through resistors 65, 66 and 67 to the capacitors 14, 20 and 31, respectively, to tune the antenna, RF amplifier, and local oscillator stages to the desired frequency. By varying the potential obtained from the tuning control circuit 50, the bias on all of the voltage variable capacitors 14, 20 and 31 is changed, thereby making it possible to tune the radio through a wide range of frequencies.

The pushbutton tuning control unit 50 shown in FIG. 1 is illustrated as including two pushbutton tuning circuits, 112 and 112*a* and a manual tuning circuit 148. Only these three tuning circuits have been illustrated for purposes of this description, although in most applications more than two pushbutton tuning circuits will be provided. Since all of the pushbutton tuning circuits are similar to the circuits 112 and 112*a*, however, the additional pushbutton tuning circuits have been eliminated from the drawing in order to simplify the description of the invention. The pushbutton tuner 50 includes momentary pushbutton switches 100, 102 and 110, with the pushbutton switches 100 and 102 being associated with particular pushbuttons on the radio and the momentary switch 110 being used for manual tuning of the radio, as will be described subsequently. The operation and circuitry connected to each of the pushbuttons 100, 102 and 110 is similar, and for simplicity this discussion will be directed to the interaction of only two of the pushbuttons. It should be understood that operation of any additional pushbutton circuits in the pushbutton control unit 50 is the same, irrespective of the particular number of pushbutton stages which are utilized in a particular receiver.

The momentary pushbutton 100 is coupled to a semiconductor switching circuit 112, comprising a pair of PNP transistors 114 and 116. This coupling is effected through a diode 118 which is provided to isolate DC potential appearing on the collector of the transistor 114 from being applied to the input circuits of other stages of the pushbutton circuit 50. The transistors 114 and 116 are operated as on-off switching devices, and the emitters of these transistors are connected through a potentiometer 120 and a resistor 122 to B+ power supply. A Zener diode 124 provides a regulated B+ potential to the potentiometer 120, and a capacitor 126 is provided to filter out any line ripple in the DC potential supplied to the emitters of the transistors 114 and 116. The pushbutton switching circuit 112*a* also includes a pair of transistors 114*a* and 116*a* which are comparable to the transistors 114 and 116 in the switch 112. The emitters of these transistors 114*a* and 116*a* are connected through a potentiometer 120*a* to the regulated B+ potential obtained from the Zener diode 124. Similarly, additional stages of the pushbutton tuning unit 50 may be provided, all identical to the stages 112 and 112*a* which have been described.

In order to provide a particular output tuning voltage from the stages 112 and 112*a*, the potentiometers 120 and 120*a* associated with the pushbuttons 100 and 102 are manually pre-set to a position for providing the direct current bias on the voltage variable capacitors corresponding to the frequency of a desired broadcasting station to be selected by momentary operation of the associated pushbutton 100 or 102. In order to insure that the potential applied to the emitters of the transistors 116 and 116*a* is always greater than the .7 volt needed to drive these transistors into conduction, resistors 119 and 119*a* are connected in series with the potentiometers 120 and 120*a* between the lower terminals of these potentiometers and ground.

Assume that it is desired to tune the radio receiver to the station selected by the setting of the potentiometer 120 in the pushbutton control circuit 112. In order to accomplish this, the pushbutton 100 is momentarily engaged to couple a potential from a direct current source 130 through the diode 118 to the base of control electrode of the transistor 116 to bias that transistor into a non-conductive state, since this potential exceeds the potential present on the emitter of that transistor. With the transistor 116 biased into a non-conductive state, the potential on its collector drops to near ground potential, causing the potential on the base of the transistor 114 to be reduced. The transistor 114 then commences to conduct to couple a potential across the potentiometer 120 through a diode 134 to the voltage variable capacitors through the resistors 65, 66 and 67. The particular potential which is coupled through the diode 134 depends of course, upon the setting of the potentiometer 120. The potential present on the collector of the transistor 114 also is applied through a resistor 136 to the base of the transistor 116 to continue to reverse bias the transistor 116 to keep it turned off so long as the transistor 114 is conducting.

Simultaneously with the foregoing operation of the switch circuit 112, the momentary positive potential obtained by closure of the switch 100 also is coupled through diodes 140 and 160 in the stages 112*a* and 148 of the tuning circuit 50. The operation of each of the circuits 112*a* and 148 is identical, so that only the operation of the circuit 112*a* will be described here. The diode 140 passes the positive potential and applies it to the base of the transistor 114*a* across the base resistor 142 thereby back-biasing the transistor 114*a* into a state of non-conduction. When the transistor 114*a* is rendered non-conductive, the potential on its collector drops to a level sufficient to cause the transistor 116*a* to be biased into conduction, and the potential present on the collector of the transistor 116*a* rises and is applied to the base of the transistor 114*a* to maintain it in a state of non-conduction.

Similar connections are made from the pushbutton 100 to the other stages in the pushbutton tuner 50, so that the additional stages in the tuning unit 50 all are biased to a state of non-conduction. Thus, only the potentiometer 120 associated with the switching circuit 112 connected to the pushbutton 100 controls the tuning of the radio receiver. The resistor 117*a* connected in series with the resistor 136*a* between the base of the transistor 116*a* and ground limits the emitter-to-base current coupled to ground reference potential, so that the potential determined by the voltage divider formed by the resistors 136*a* and 117*a* cannot exceed the lowest control voltage applied to the voltage variable capacitors by the selected pushbutton.

If the operator of the radio receiver now desires to listen to the broadcast station associated with the pushbutton 102, he momentarily closes the pushbutton 102, coupling a positive potential to the control or base electrode of the transistor 116*a*, biasing that transistor off and biasing on the transistor 114*a* in the same manner described above in the detailed description of the operation of the transistors 114 and 116. At the same time, the transistor 114 in the circuit 112 is biased into a state of non-conduction by the positive potential applied through a diode 140*b* to the base of the transistor 114, thereby driving the transistor 114 into a state of non-conduction. The transistor 116 then is rendered conductive and insures that the transistor 114 remains off once the momentary switch 102 is opened. Similar connections from the switch 102 are made to other pushbutton stages in the radio receiver and also are made to the manual tuning stage 148 in the same manner described previously in conjunction with the operation of the momentary pushbutton switch 100.

Thus, it can be seen that momentarily closing any one of the pushbuttons 100, 102, or any other similar pushbuttons in the tuning circuit 50, resulting in transfering control of the tuning of the voltage variable capacitors 14, 20 and 31 to the potentiometer associated with the particular selected switch and operates to de-energize the switches associated with the remaining pushbuttons in the tuning unit 50.

As with conventional pushbutton radios, it is desirable to provide for manual tuning of the the radio; and this is obtained from the tuning circuit 148 controlled by the pushbutton switch 110. A potentiometer 145, the arm of which is manually positioned by a knob similar to a conventional manual control knob, changes the bias on the voltage variable capacitors to tune the radio through the broadcast band whenever the momentary pushbutton 110 is operated to select the tuning switch 148. Momentarily engaging the pushbutton 110 couples a direct current positive potential from the source 130 through a diode 147 to the base electrode of a PNP transistor 150, biasing that transistor off and causing a transistor 152 to be biased into a state of conduction due to the drop in potential coupled to the base of the transistor 152 from the collector of the transistor 150. When the transistor 152 is rendered conductive, the potential selected by the tap on the potentiometer 145 is coupled through the transistor 152 and a diode 154 to the voltage variable capacitors of the radio receiver. At the time the switch 110 is operated, a positive pulse is applied through diodes **156*c* and 156*d* to the bases of the transistors 114 and 114*a* to render those transistors non-conductive, thereby removing control of the tuning of the voltage variable capacitors from the pushbutton circuits 112 and 112*a*. This operation is identical to the operation which occurs to remove control of the tuning from the manual tuning circuit 148 whenever one of the momentary pushbuttons 100 or 102 is operated to select a particular pushbutton potentiometer. The resistors 146 and 151 in the circuit 148 provide the functions previously described for the resistors 119 and 117** respectively.

The circuit described thus far provides a means for electronic selection in a pushbutton radio of particular stations. In the normal operation of a pushbutton radio, the desired stations first are located by operation of the manual tuning knob of the radio; and whenever a station is reached by manual tuning which the operator desires to have transferred to pushbutton operation so that it may subsequently automatically be selected by operation of that particular pushbutton, the pushbutton is set mechanically in a conventional radio. To set the electronic pushbutton radio thus far described, however, it is necessary to provide a manual tuning of the potentiometer associated with a particular pushbutton to cause it to correspond to the desired station.

If the desired station is found by tuning of the manual tuning potentiometer 145, there exists a problem that when the tuning of the radio is switched tothe potentiometer 120, the station may change its programming before the potentiometer 120 can be tuned to a position comparable to that set by the manual potentiometer 145 in originally finding the desired station. When this occurs, it is difficult to be certain that the pushbutton is tuned to the station which previously was selected by the manual tuning circuit, since control of the tuning has been removed from the manual tuning circuit by operation of the pushbutton momentary switch, such as the switch 100, associated with the desired pushbutton circuit which is to be set to that station.

As a consequence, a comparator circuit 80 is provided and consists of a pair of NPN transistors 81 and 82 interconnected so that the emitters of each of the transistors are directly connected to the bases of the other of the transistors. As a consequence, the emitter of the transistor 81 is connected to the base of the transistor 82 and the emitter of the transistor 82 is connected to the base of the transistor 81. The collectors of each of these transistors are connected to an equal source of B+ through collector resistors 83 and 84, respectively, and the collectors are interconnected through a suitable indicating device such as a lamp 85. Operation of the transistors 81 and 82 then is controlled by the tap on the manual potentiometer 145 which is connected through a pair of diodes 157, 158 to the junction between the base of the transistor 81 and the emitter of the transistor 82 and is further controlled by the output of the selected tuning circuit which is supplied to the voltage variable capacitors, with this output being connected to the junction between the base of the transistor 82 and the emitter of the transistor 81. The diodes 157, 158 provide a forward voltage drop equal to the drop across the transistor and diode of the selected tuning circuit, such as the transistor 114 and diode 134. This insures that the potential supplied to the indicator 80 and the voltage variable capacitors are the same.

The comparator circuit 80 provides a direct means for indicating whether or not the tap on the potentiometer selected in any one of the pushbutton control circuits is set at the same voltage level as the tap on the potentiometer 145 in the annual tuning circuit. This manner of comparison is such that whenever the two voltages applied to the two inputs of the comparator circuit 80 are the same, both of the transistors 81 and 82 are non-conductive, and no current flows through the lamp 85 due to the equal potentials applied to the other terminals of the resistors 83 and 84. If, however, the potential obtained from the tap 145 on the manual potentiometer is more positive than the potential applied to the output of the tuning circuit from the tap on the selected pushbutton switch potentiometer, the transistor 81 is rendered conductive and current flows from the battery through the resistor 84, the lamp 85 and the transistor 81; and the indicator lamp 85 lights indicating that tuning has not been achieved. On the other hand, if the potential obtained from the manual potentiometer 145 is less positive than the potential obtained from the output of the tuning circuits, the transistor 82 is rendered conductive and the transistor 81 is rendered non-conductive, again creating a voltage imbalance across the lamp 85 causing it to light. It should be noted that current in this situation flows in the opposite direction from that when the transistor 82 is non-conductive and the transistor 81 is conductive.

As a result, is it possible to accurately tune the pushbutton potentiometer associated with a particular pushbutton circuit to the same position previously obtained by the operation of the manual potentiometer in the manual tuning circuit, even though the station content changes or the station ceases broadcasting, since the indicator lamp 85 is extinguished when the two potentiometers are tuned to provide the same output voltage to the voltage variable capacitors in the tuned circuits of the radio receiver.

Figure 2:
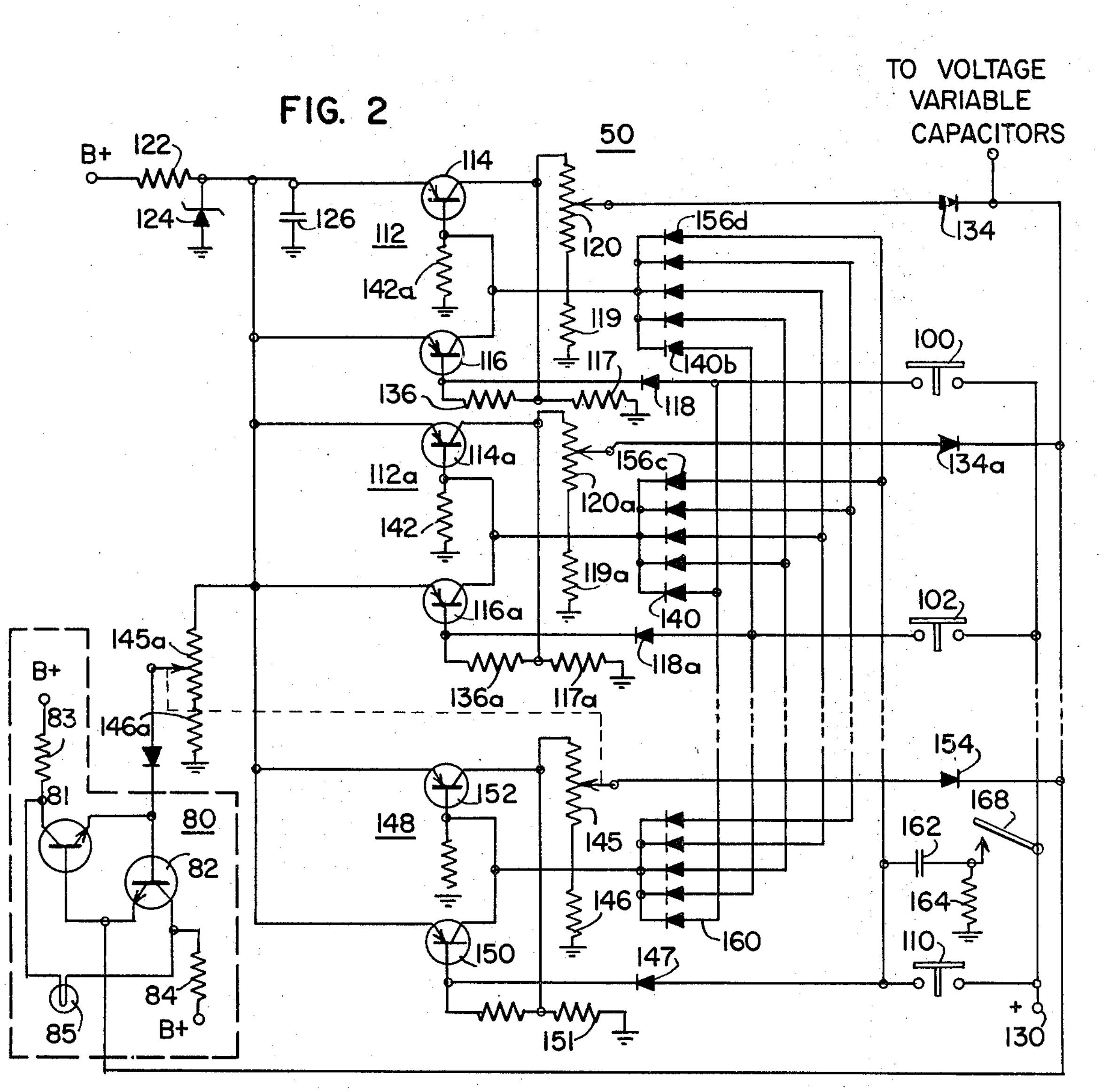
FIG. 2 is a schematic wiring diagram partially in block form illustrating a second embodiment of an electronically tuned radio.

Referring now to FIG. 2 there is shown another embodiment of the tuning control unit 50 in which the tuning potentiometers are located in the collector circuits of the output transistors 114, **114*a* and 152 of the tuning circuits 112, 112*a* and 148, respectively. In the circuit shown in FIG. 2 similar reference numerals are used for the same elements illustrated in FIG. 1, and the regulated DC supply voltage obtained from the junction between the resistor 122 and 124 is connected directly to the emitters of the transistors 114, 116; 114*a*, 116*a*; and 150, 152. The outputs of the potentiometers 120, 120*a* and 145 associated with the switching circuits 112, 112*a* and 148 are then supplied through the output diodes 134, 134*a* and 154** respectively in the same manner as the outputs were supplied in the circuit shown in FIG. 1.

In order to provide comparison of the settings of the manual potentiometer 145 and the settings of the pushbutton potentiometer of a selected pushbutton station when it is desired to tune that station to the setting of the manual control circuit 148, an additional potentiometer **145*a* connected in series with a resistor 146*a* between the regulated DC potential obtained from the Zener diode 124 and ground is provided. The potentiometer 145*a* is selected to correspond to the potentiometer 145 and is gang-tuned therewith to provide an output voltage which is indicative of the same output voltage obtained from the potentiometer 145. The output of the potentiometer 145***a* then is connected to one of the inputs of the comparator circuit 80, with the other input of the comparator circuit being obtained from the outputs of the diodes 134, 134*a* and 154 in the same manner as described previously in conjunction with FIG. 1. The comparator circuit 80 then operates in the same manner as described previously; so that whenever the setting of the potentiometer in the pushbutton circuit corresponds to the comparable setting of the potentiometer on the auxiliary potentiometer 145*a*, the lamp 85 is extinguished indicating corresponding tuning of the two circuits.

In the portion of the circuits of FIG. 1 and FIG. 2 which have been described thus far, it has been shown that the operating potential for the circuit is obtained from B+ through the Zener regulating circuit 122 and 124 and is applied to all of the control switches 112, 112*a* and 148. It should be noted that this operating potential may be provided continuously, even though the rest of the radio receiver is turned off when operation of the receiver is not desired. By allowing this operating potential for the tuning circuit to remain even when the radio is turned off, a memory for the tuner is provided. Then when the radio receiver is subsequently turned on, the receiver is tuned to the last position it was in, which is comparable to a conventional mechanical pushbutton tuner.

If this radio receiver is used in an automobile, the B+ applied to the Zener regulating circuit is obtained directly from the automobile battery and is not applied through the volume control on-off switch. When the radio is turned off, the B+ is still connected to the push-button circuit thereby retaining the position of the last setting. In the use of a solid state pushbutton control circuit of the type illustrated in FIGS. 1 and 2, a control circuit including a manual control circuit and five pushbutton circuits draws approximately 20 milliamps of current; and this is considered small enough so as not to discharge the automobile battery to too great a degree over a prolonged period of time.

If it is desired to turn off or disconnect the pushbutton circuits, the B+ shown in FIGS. 1 and 2 can be applied through the conventional volume control on-off switch for the radio. In this event, it is desirable to return the tuner to some predetermined control circuit whenever the radio is re-energized; and this can be accomplished by the provision of a priority circuit consisting of a capacitor 162 across which a resistor 164 is connected. An auxiliary on-off switch 168 then couples a pulse from the B+ supply 130 when the switch 168 is initially closed to energize the radio; and this positive pulse is applied through the capacitor 162 and a diode 147 to bias off the transistor 150 in the manual control circuit, and correspondingly to cause the transistor 152 to be rendered conductive to couple the potential present on the manual tuning potentiometer 145 to the voltage variable capacitors in the tuned circuits of the radio receiver. This pulse also serves to bias nonconductive the transistors 114 and 114*a* in the pushbutton control circuits 112 and 112*a*.

When the capacitor 162 charges up to the potential of the source 130, current ceases to flow through this circuit and priority may be taken from the manual tuning circuit at any time thereafter by momentarily engaging one of the pushbuttons 100 or 102. If manual tuning then subsequently is desired after a pushbutton has been used, it is merely necessary to engage the momentary pushbutton 110 and priority is returned to the manual control circuit 148. Whenever the radio then is de-energized or turned off, the capacitor 162 discharges through the resistor 164 to prepare the priority circuit for the next operation of the radio.

It will be apparent that the priority need not necessarily be provided to the manual control circuit, since a similar circuit can be used in conjunction with any of the circuits 112 or 112*a* associated with a particular pushbutton of the radio. If such priority is not desired, and if the memory provision of the tuner is desired the components 162, 164 and 168 can be eliminated from the circuit.

Figure 3:
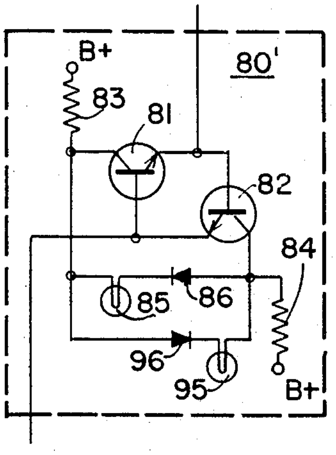
FIG. 3 is a schematic wiring diagram of a comparator circuit which can be used in place of the comparator circuit used in the circuits shown in FIGS. 1 and 2.

Referring now to FIG. 3, there is shown an alternative embodiment of the comparator circuit 80 which has been designated as comparator circuit 80'. The comparator circuit 80' is essentially the same as the comparator circuit 80, with the exception that a pair of indicating lamps 85 and 95 are connected in series with oppositely poled diodes 86 and 96 between the collectors of the transistors 81 and 82 in the comparator. Conduction of the transistors 81 and 82 is controlled in the same manner as described previously in conjunction with the comparator 80. The diodes 86 and 96, however, permit current to flow in only one direction in the branches in which they are connected.

Thus, whenever the transistor 82 is non-conductive and the transistor 81 is conductive, current flows only through the diode 86 and the indicator lamp 85 indicating, in the case of the circuit of FIG. 1, that the manual potentiometer 145 is set to a higher potential than the potential to which the pushbutton tuning circuit potentiometer is set. Conversely, if the pushbutton tuning potentiometer in the circuit of FIG. 1 is set to a lower potential than the potential present on the manual potentiometer 145 with the circuit 80' being used, the current flow is in the opposite direction through the diode 96 and the lamp 95, causing the lamp 95 to be energized and the indicator lamp 85 to be extinguished.

When the potentials are equal, indicating correct tuning of the pushbutton circuit to correspond to the setting of the manual circuit, both of the lamps 85 and 95 are extinguished, and the pushbutton is set to the desired station location. The circuit of FIG. 3 thus indicates to the operator of the tuner in which direction he should alter the setting of the potentiometer in the pushbutton circuit to cause it to be pulled into agreement with the setting of the manual potentiometer in the manual circuit.

The systems described provide accurate means for adjusting the setting of the pushbutton potentiometer in an elecronically tuned pushbutton radio to correspond to the setting of a manual potentiometer which was used in order to select the station to which the pushbutton potentiometer circuit is desired to be set. The comparator circuit employed is a simple yet accurate device for providing this indication, and the operator of the radio receiver knows that the pushbutton is adjusted to the proper setting, even though the radio station changes content or ceases broadcasting between the time that the station was tuned by the manual potentiometer and the time the adjustment is made in the pushbutton circuit.

What is claimed is:

1. A system for selectively applying a bias potential to a voltage variable capacitor connected in a tuned circuit stage of a wave signal receiver for tuning the circuit through a range of frequencies in response to variations in the bias potential applied to the capacitor, the system including in combination:

a primary tuning means capable of being set for providing a variable output voltage in accordance with particular settings thereof;

a plurality of tuning control means each capable of being set for providing a variable voltage output in accordance with the settings thereof;

switching circuit means for connecting the output voltage of one of the tuning means to the voltage variable capacitor; and comparison means for comparing the setting of the tuning means connected to the capacitor by the switching means with the setting of the primary tuning means to provide an output indicative of agreement or disagreement of the compared settings.

2. The combination according to claim 1 wherein the primary tuning means and the plurality of tuning control means each includes a potentiometer adjustable to provide the desired output voltage therefrom.

3. The combination according to claim 1 wherein the comparison means provides an output indicative of agreement or disagreement between the variable voltage output obtained from the selected tuning control means with the variable voltage output of the primary tuning means.

4. The combination according to claim 1 wherein each of the variable output voltages obtained from the primary tuning means and the tuning control means is obtained from a setting of a potentiometer and further wherein the comparison means provides a desired output indicating that the settings of the compared tuning means are the same whenever the output voltage obtained from the potentiometer of the primary tuning means is the same as the output voltage obtained from the potentiometer of the selected tuning control means.

5. The combination according to claim 1 wherein the comparison means includes an indicating device and an electronic switch means, said electronic switch means being connected across the indicating device and providing current flow through the indicating device only when the voltages supplied to the comparison means from the outputs of the primary tuning means and the tuning control means are different.

6. A pushbutton type wave signal receiver having a signal processing stage including a voltage variable capacitor responsive to a variable direct current bias for tuning the stage through a range of frequencies including in combination:

a primary tuning means having an adjustable potentiometer means therein for providing a variable output voltage in accordance with the setting of the potentiometer means;

a plurality of pushbutton switches each having potentiometer means therein for providing a variable output voltage in accordance with the setting of the corresponding potentiometer means;

switching circuit means connected to the primary tuning means and to each of the pushbutton switches for connecting the output of a selected one of the potentiometers to the voltage variable capacitor for supplying direct current bias thereto; and comparator means supplied with a voltage indicative of the output of the potentiometer in the primary tuning means and further supplied with a voltage indicative of the output of the potentiometer of the selected tuning means for effecting a comparison of the settings of the two potentiometers.

7. The combination according to claim 6 further including an indicator means connected to the output of the comparator means for indicating whenever the potentiometer setting of the primary tuning means and the selected tuning means are the same.

8. The combination according to claim 7 wherein the comparator means includes a pair of transistors of the same conductivity type, the transistors each having base, collector, and emitter electrodes and wherein the emitter electrodes of each of the transistors is connected to the base electrode of the other of the transistors, with the two potentiometer output voltages to be compared being supplied respectively to the junctions between the emitter and base connections thus made, and further wherein the collector electrodes of the transistors are connected to equal potential sources through collector resistors, and the indicator means is connected between the collector electrodes of the transistors.

9. The combination according to claim 8 wherein one of the transistors is rendered conductive whenever a first of the potentiometer output voltages exceeds the magnitude of the other of the potentiometer output voltages and wherein the second of the transistors is rendered conductive whenever the other of the potentiometer output voltages exceeds the magnitude of the first of the potentiometer output voltages and where neither of said transistors is rendered conductive whenever the magnitudes of the potentiometer output voltages are equal.

10. The combination according to claim 8 includes a pair of indicator means, each connected in series with a unidirectional current conducting device between the collectors of the transistors, and wherein the unidirectional current conducting devices are poled in opposite directions, so that whenever the first one of the transistors conducts, one of the indicating devices has current flowing therethrough whereas current flow through the other indicating device is blocked by the unidirectional current conducting device connected in series therewith, and wherein whenever the other one of the transistors is rendered conductive, current flows through the other of the indicating devices and is blocked from flowing through the first of the indicating devices.

References Cited

UNITED STATES PATENTS

| | | | |
|---|---|---|---|
| 3,204,207 | 8/1965 | Denker | 334—15 |
| 3,354,397 | 11/1967 | Wittig | 334—15 X |
| 3,439,292 | 4/1969 | Henry | 334—7 |

HERMAN KARL SAALBACH, Primary Examiner

P. L. GENSLER, Assistant Examiner

U.S. Cl. X.R.

307—235; 325—455, 465; 334—15